United States Patent
Huang et al.

(10) Patent No.: US 9,093,611 B2
(45) Date of Patent: Jul. 28, 2015

(54) LIGHT-EMITTING DIODE CHIP

(71) Applicant: LEXTAR ELECTRONICS CORPORATION, Hsinchu (TW)

(72) Inventors: Wan-Chun Huang, Taichung (TW); Wei-Chang Yu, Koahsiung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/306,115

(22) Filed: Jun. 16, 2014

(65) Prior Publication Data

US 2015/0069451 A1    Mar. 12, 2015

(30) Foreign Application Priority Data

Sep. 9, 2013  (TW) .............. 102132375 A

(51) Int. Cl.
  *H01L 33/00*   (2010.01)
  *H01L 33/38*   (2010.01)
(52) U.S. Cl.
  CPC .................... *H01L 33/382* (2013.01)

(58) Field of Classification Search
  USPC .............................. 257/98, 99, 100
  See application file for complete search history.

(56) References Cited

U.S. PATENT DOCUMENTS

| | | | |
|---|---|---|---|
| 2005/0133807 A1* | 6/2005 | Park et al. | 257/99 |
| 2007/0228388 A1* | 10/2007 | Ko et al. | 257/79 |
| 2010/0006885 A1* | 1/2010 | Gong | 257/99 |
| 2010/0163910 A1* | 7/2010 | Bougrov et al. | 257/98 |
| 2010/0258836 A1* | 10/2010 | Wang et al. | 257/99 |
| 2011/0163346 A1* | 7/2011 | Seo et al. | 257/99 |

\* cited by examiner

*Primary Examiner* — Bilkis Jahan

(57) ABSTRACT

An LED chip is disclosed. The LED chip includes a substrate and a semiconductor element formed on the substrate. A recess is formed on the semiconductor element so as to expose a first-type of semiconductor layer thereof to the environment. The LED chip also includes a conductive layer disposed on a second-type semiconductor layer of the semiconductor element, a first electrode disposed in the recess and electrically connected to the first-type of semiconductor layer, and a second electrode disposed on the conductive layer. In addition, the LED chip includes a first circular electrode disposed on the conductive layer and extending along an edge of the substrate and electrically connected to the second electrode.

14 Claims, 10 Drawing Sheets

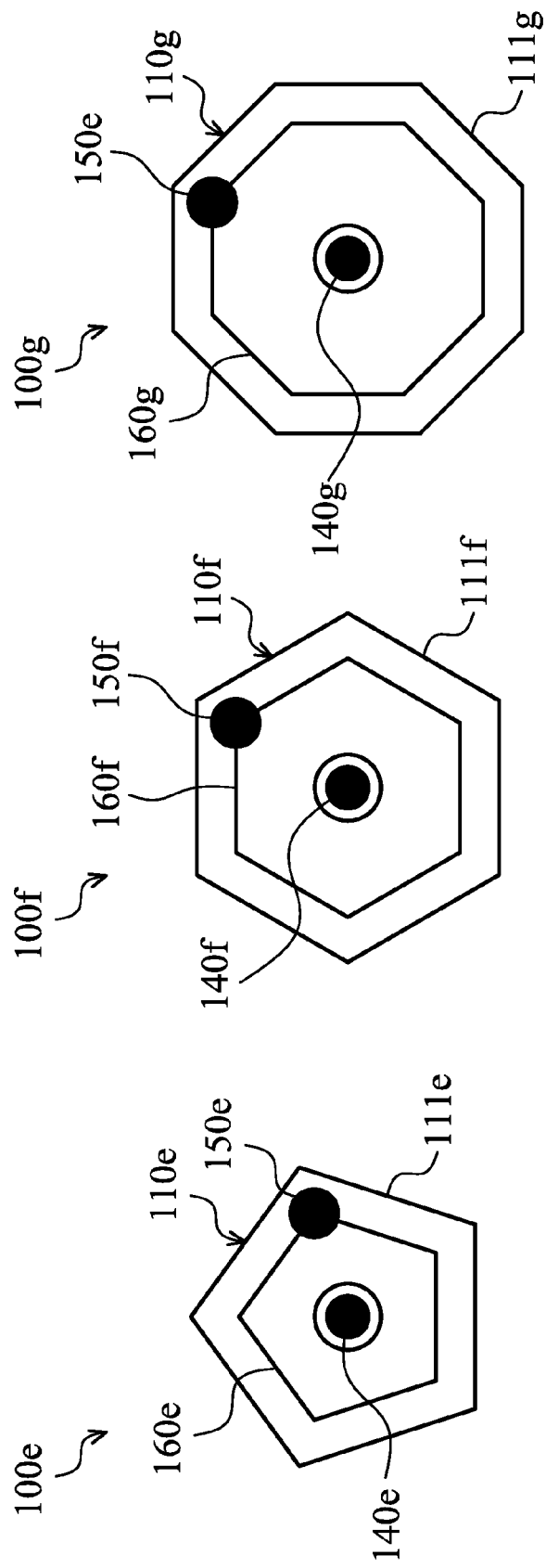

LIGHT-EMITTING DIODE CHIP

CROSS REFERENCE TO RELATED APPLICATIONS

This Application claims priority of Taiwan Patent Application No. 102132375, filed on Sep. 9, 2013, the entirety of which is incorporated by reference herein.

BACKGROUND OF THE INVENTION

1. Field of the Invention

The present invention relates to a semiconductor element, and more particularly to an LED (light-emitting diode) chip.

2. Description of the Related Art

The light-emitting diode (LED) emits light by converting electric energy into optical energy. The LED is mainly composed of semiconductors. Of the semiconductors, those having a larger ratio of holes carrying positive electricity are referred to as P type semiconductors, and those having a larger ratio of electrons carrying negative electricity are referred to as N type semiconductors. The joint connecting a P type semiconductor and an N type semiconductor forms a PN junction. When voltage is applied to the positive electrode and the negative electrode of an LED, the electrons and the holes will be combined and emitted in the form of light.

In addition, the luminous intensity of an LED is related to the current density of a voltage applied thereto. In general, the luminous intensity increases with the increase in the current density. However, it is not easy to increase the light extraction efficiency and at the same time make the current uniformly diffused. In a conventional method, the current can be uniformly diffused by extending the electrodes. By doing so, the light-emitting area is reduced and the luminous intensity deteriorates accordingly. Conversely, if the luminous intensity is increased by reducing the light-blocking area of the electrodes, the current cannot be diffused uniformly and the effect of heat concentration will be worsened. Therefore, how to make the current density uniformly distributed without affecting the luminous intensity has become a prominent task for the industry

BRIEF SUMMARY OF THE INVENTION

One objective of the present invention is to provide an LED chip. With a reduction of the light-blocking area of an electrode and an increase of current uniformity, the luminous intensity of the LED chip is improved.

According to some embodiments of the disclosure, the LED chip includes a substrate, a semiconductor element, a conductive layer, a first electrode, a second electrode, and a first circular electrode. The semiconductor element includes a first-type semiconductor layer, a light-emitting layer, and a second-type semiconductor layer stacked in order from the substrate. A recess is formed on the second-type semiconductor layer, and a portion of the first-type semiconductor layer is exposed to the environment by the recess. The first electrode is disposed on the portion of the first-type semiconductor layer that is exposed by the recess. The conductive layer is disposed on the second-type semiconductor layer, and the second electrode is disposed on the conductive layer. The first circular electrode is disposed on the conductive layer. The first circular electrode extends along an edge of the substrate and is electrically connected to the second electrode so as to form a closed loop circuit.

In some embodiments, the LED chip also includes a second circular electrode disposed on the conductive layer and located between the first electrode and the first circular electrode. The second circular electrode extends in a manner parallel to the first circular electrode and is electrically connected to the second electrode via a first elongated electrode. The first circular electrode and the second circular electrode are spaced the same distance apart.

In some embodiments, an orthographic projection of the substrate is in a shape of a rectangle or any other geometric shape in which all sides are equal. The LED chip further includes a number of second elongated electrodes formed on the conductive layer. The first circular electrode has a plurality of bending portions, and each of the second elongated electrodes extends toward the first electrode from the bending portions. In addition, the LED chip includes a number of third elongated electrodes formed on the conductive layer. The third elongated electrodes are spaced the same distance away from each other, and each of the third elongated electrodes is disposed between two neighboring second elongated electrodes and extends toward the first electrode from the first circular electrode.

In some embodiments, an orthographic projection of the substrate is a circular shape. The LED chip further includes a number of fourth elongated electrodes formed on the conductive layer. The fourth elongated electrodes are spaced the same distance away from each other, and each of the fourth elongated electrodes extends toward the first electrode from the first circular electrode.

In the aforementioned embodiments, a thickness of the conductive layer is in a range from 60 nm to 160 nm, so as to increase luminous intensity.

In the aforementioned embodiments, the first-type semiconductor layer is an N-type semiconductor layer and the second-type semiconductor layer is a P-type semiconductor layer. Alternatively, the first-type semiconductor layer is a P-type semiconductor layer and the second-type semiconductor layer is an N-type semiconductor layer.

BRIEF DESCRIPTION OF THE DRAWINGS

The invention can be more fully understood by reading the subsequent detailed description and examples with references made to the accompanying drawings.

FIG. 10 shows a schematic top view of an LED chip, in accordance with some embodiments.

FIG. 11 shows a schematic top view of an LED chip, in accordance with some embodiments.

FIG. 12 shows a schematic top view of an LED chip, in accordance with some embodiments.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
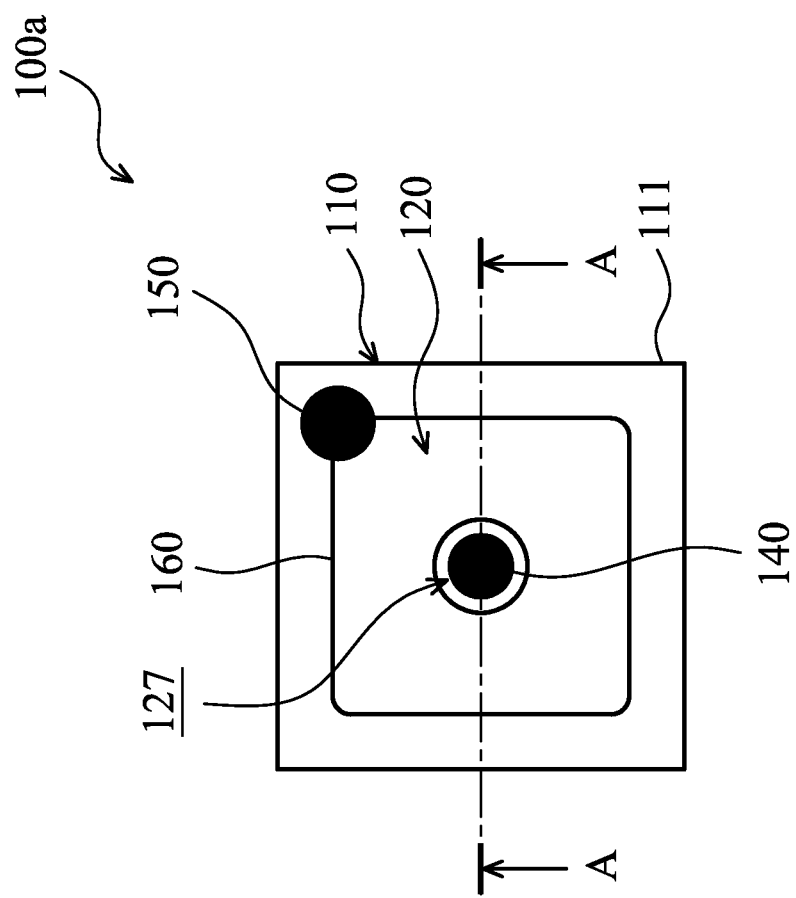
FIG. 1 shows a schematic top view of an LED chip, in accordance with some embodiments.
Figure 2:
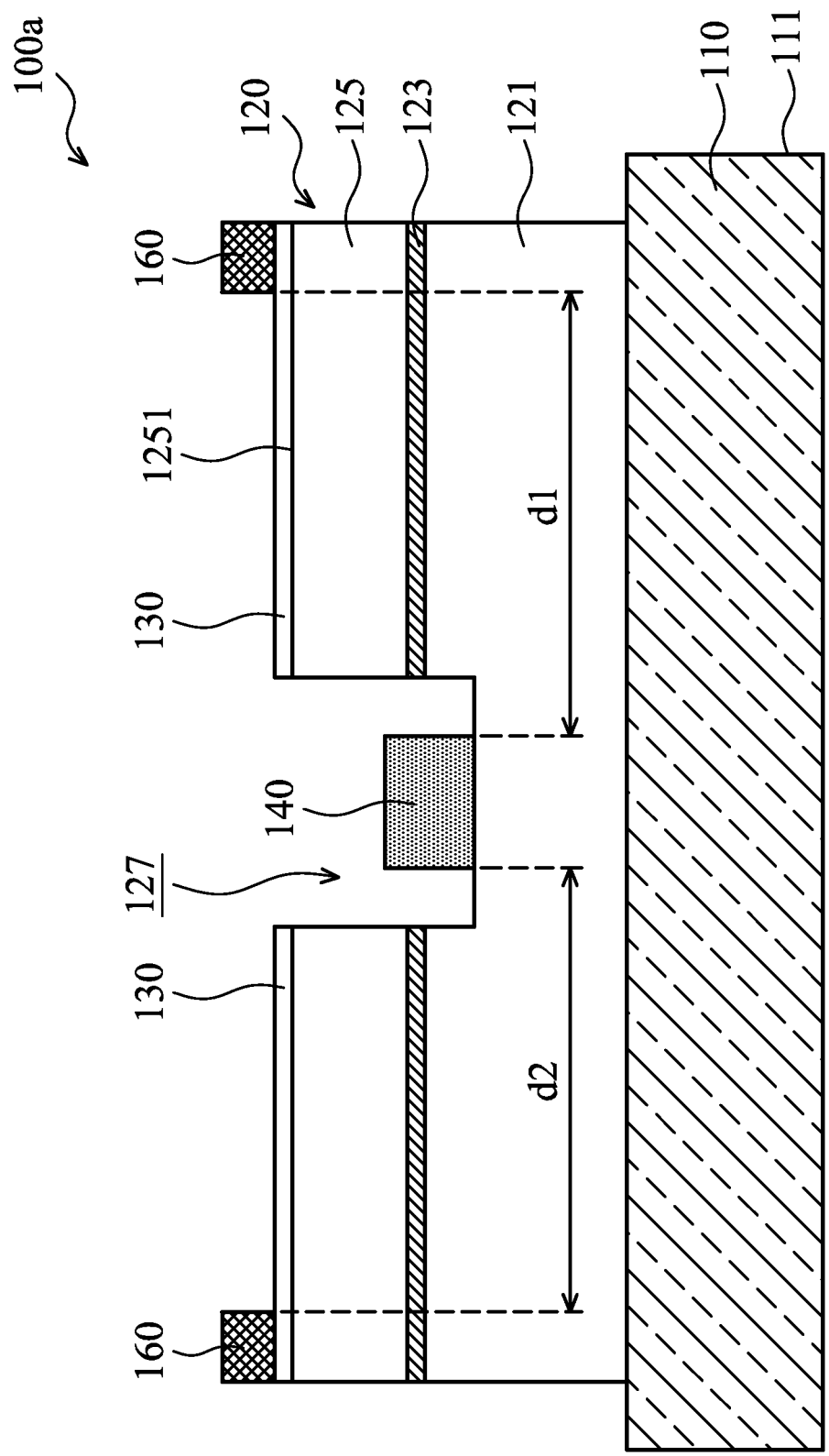
FIG. 2 shows a cross-sectional view of the LED chip taken along the line A-A of FIG. 1.

Referring to FIGS. 1 and 2, a schematic top view of an LED chip 100a, in accordance with some embodiments, is shown in FIG. 1, and a cross-sectional view taken along the line A-A of FIG. 1 is shown in FIG. 2. In some embodiments, the LED chip 100a includes a substrate 110, a semiconductor element 120, a conductive layer 130, a first electrode 140, a second electrode 150, and a first circular electrode 160.

In some embodiments, the substrate 110 has a rectangular cross section. Namely, an orthographic projection of the substrate is in a shape of a rectangle. The semiconductor element 120 includes a first-type semiconductor layer 121, a light-emitting layer 123, and a second-type semiconductor layer 125 arranged in order from the end contacting the substrate 100. The first-type semiconductor layer 121 may be a P-type semiconductor layer, and the second-type semiconductor layer 125 may be an N-type semiconductor layer. The first-type semiconductor layer 121, the light-emitting layer 123 and the second-type semiconductor layer 125 may be formed by a nitride containing the elements of group IIIA of the periodic table, such as aluminum nitride, gallium nitride or indium gallium nitride. Therefore, when voltage is applied to the first-type semiconductor layer 121 and the second-type semiconductor layer 125, the electrons and the holes of the light-emitting layer 123 will be combined and emitted in the form of light.

As shown in FIG. 2, a recess 127 is formed in the substantial center of the second-type semiconductor layer 120. The recess 127 is depressed from the second-type semiconductor layer 120, and a portion of the first-type semiconductor layer 121 is exposed to the environment via the recess 127. The first electrode 140 is disposed in the recess 127 and electrically connected to the first-type semiconductor layer 121. The conductive layer 130 is formed on the surface 1251 of the second-type semiconductor layer 125 that is opposite to the light-emitting layer 123. The conductive layer 130 is formed by indium tin oxide (ITO) or indium zinc oxide (IZO), for example. In some embodiments, the conductive layer 130 is uniformly formed on the entire surface 1251 of the second-type semiconductor layer 125.

The second electrode 150 and the first circular electrode 160 are formed on the conductive layer 130. As shown in FIG. 1, the second electrode 150 is adjacent to a corner of the substrate 110. The first circular electrode 160 extends along an edge 111 of the substrate 110 and is electrically connected to the second electrode 150 so as to form a closed loop circuit.

Referring again to FIG. 2, to manufacture the LED chip 100a, the second electrode 150 and the first circular electrode 160 may respectively be formed on the conductive layer 130 and electrically connected to the second-type semiconductor layer 125. Alternatively, the second electrode 150 and the first circular electrode 160 are integrally formed on the conductive layer 130 and electrically connected to the second-type semiconductor layer 125. In some embodiments, the second electrode 150 and the first circular electrode 160 each have the same or a different thickness.

It should be noted that, in some embodiments, the first circular electrode 160 is separated from the first electrode 140 by a constant distance along a direction parallel to the substrate 110. Specifically, as shown in FIG. 2, there is a space measuring a distance d1 between the first electrode 140 and an inner edge of the first circular electrode 160, and there is a space measuring a distance d2 between the first electrode 140 and the other inner edge of the first circular electrode 160. The two inner edges of the first circular electrode 160 are disposed on opposite sides of the first electrode 140, and the distance d1 is equal to the distance d2. In one exemplary embodiment, the distance d1 is equal to the distance d2, and the distance d1 and the distance d2 are 0.127 mm, but the disclosure should not be limited this example.

With the distance d1 being equal to the distance d2, the electric current from the second electrode 150 or the first circular electrode 160 is uniformly distributed on the entire conductive layer 130. The current concentration that occurs at the shortest path between the second electrode 150 and the first electrode 140 is avoided. Light is evenly emitted from the LED 100a, and the heat generated from the LED 100a is uniformly dissipated. Therefore, the lighting efficiency of the LED chip 100a is improved. In addition, since the electric current is uniformly distributed on the entire conductive layer 130, the thickness of the conductive layer 130 of the LED chip 100a can be reduced accordingly. In one exemplary embodiment, the thickness of the conductive layer 130 of the LED chip 100a is in a range from about 60 nm to about 160 nm.

Figure 3:
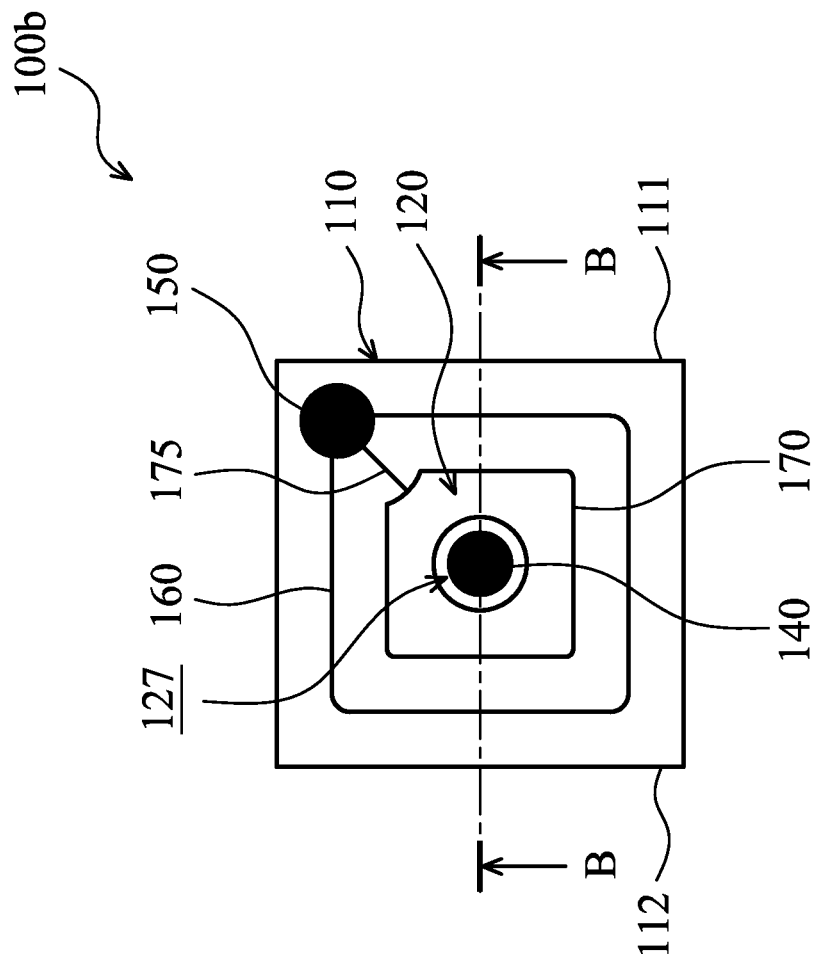
FIG. 3 shows a schematic top view of an LED chip, in accordance with some embodiments.
Figure 4:
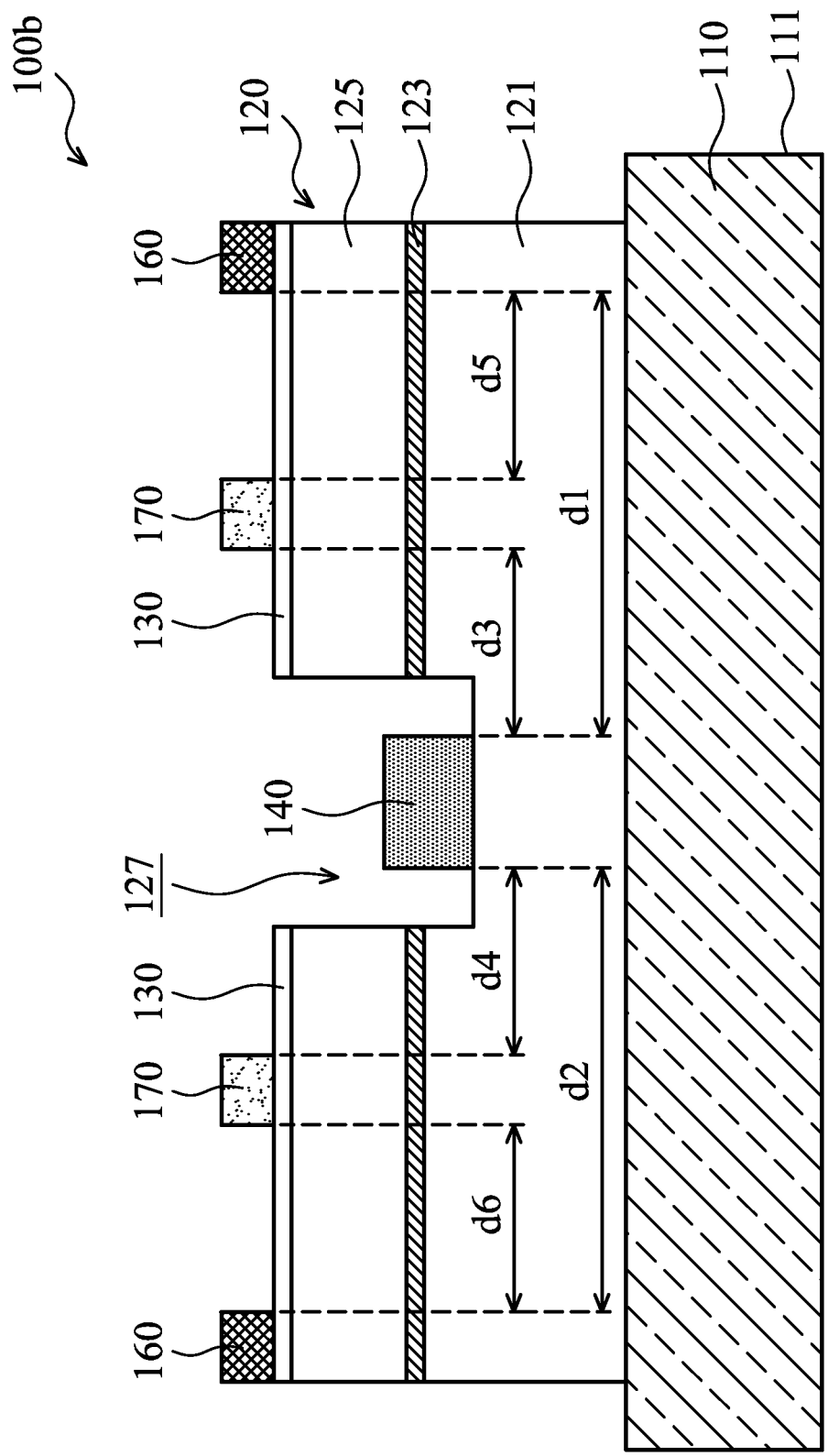
FIG. 4 shows a cross-sectional view of the LED chip taken along the line B-B of FIG. 3.

Referring to FIGS. 3 and 4, a schematic top view of an LED chip 100b, in accordance with some embodiments, is shown in FIG. 3, and a cross-sectional view taken along the line B-B of FIG. 3 is shown in FIG. 4. Since elements similar to those of the LED chip 100a shown in FIGS. 1 and 2 are provided with the same reference numbers, the features thereof are not repeated in the interests of brevity. Differences between the LED chip 100a and the LED chip 100b include that the LED chip 100b further including a second circular electrode 170 and a first elongated electrode 175. The second circular electrode 170 is located at the inner side of the first circular electrode 160. Similar to the first circular electrode 160, the second circular electrode 170 is formed on the conductive layer 130 and extends substantially parallel to the edge 111 of the substrate 110. In some embodiments, the second circular electrode 170 is directly electrically connected to the second electrode 150 via the first elongated electrode 175, but the disclosure should not be limited to the embodiments. In some other embodiments, the second circular electrode 170 is electrically connected to the second electrode 150 via a connection electrode (not shown) that connects the second circular electrode 170 to the first circular electrode 160.

As shown in FIG. 4, along a direction parallel to the substrate 110, there is a space measuring a distance d3 between the first electrode 140 and an inner edge of the second circular electrode 170, and there is a space measuring a distance d4 between the first electrode 140 and the other inner edge of the second circular electrode 170. The two inner edges of the second circular electrode 170 are disposed on opposite sides of the first electrode 140, and the distance d3 is equal to the distance d4. In addition, along the same direction parallel to the substrate 110, two outer edges of the second circular electrode 170 are spaced from two inner edges of the first circular electrode 160 by a distance d5 and a distance d6. The distance d5 is equal to the distance d6. In one exemplary embodiment, the distance d3 and the distance d4 are 0.06 mm, and the distance d5 and the distance d6 are 0.06 mm, but the disclosure should not be limited to the embodiments.

Figure 5:
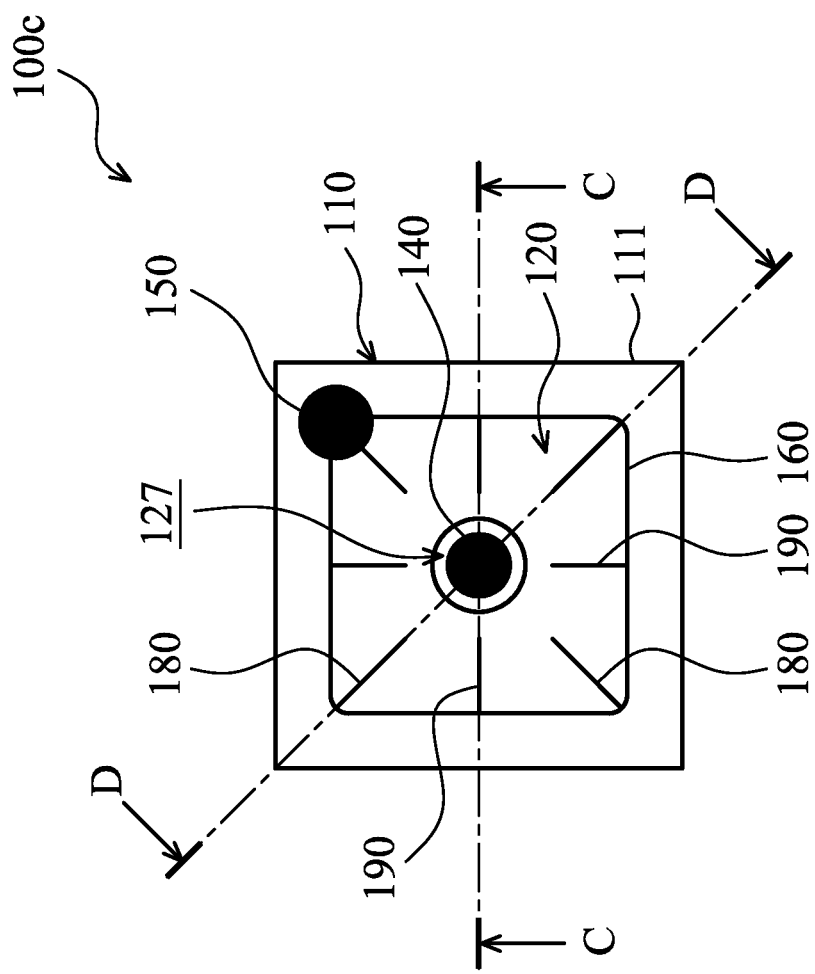
FIG. 5 shows a schematic top view of an LED chip, in accordance with some embodiments.
Figure 6:
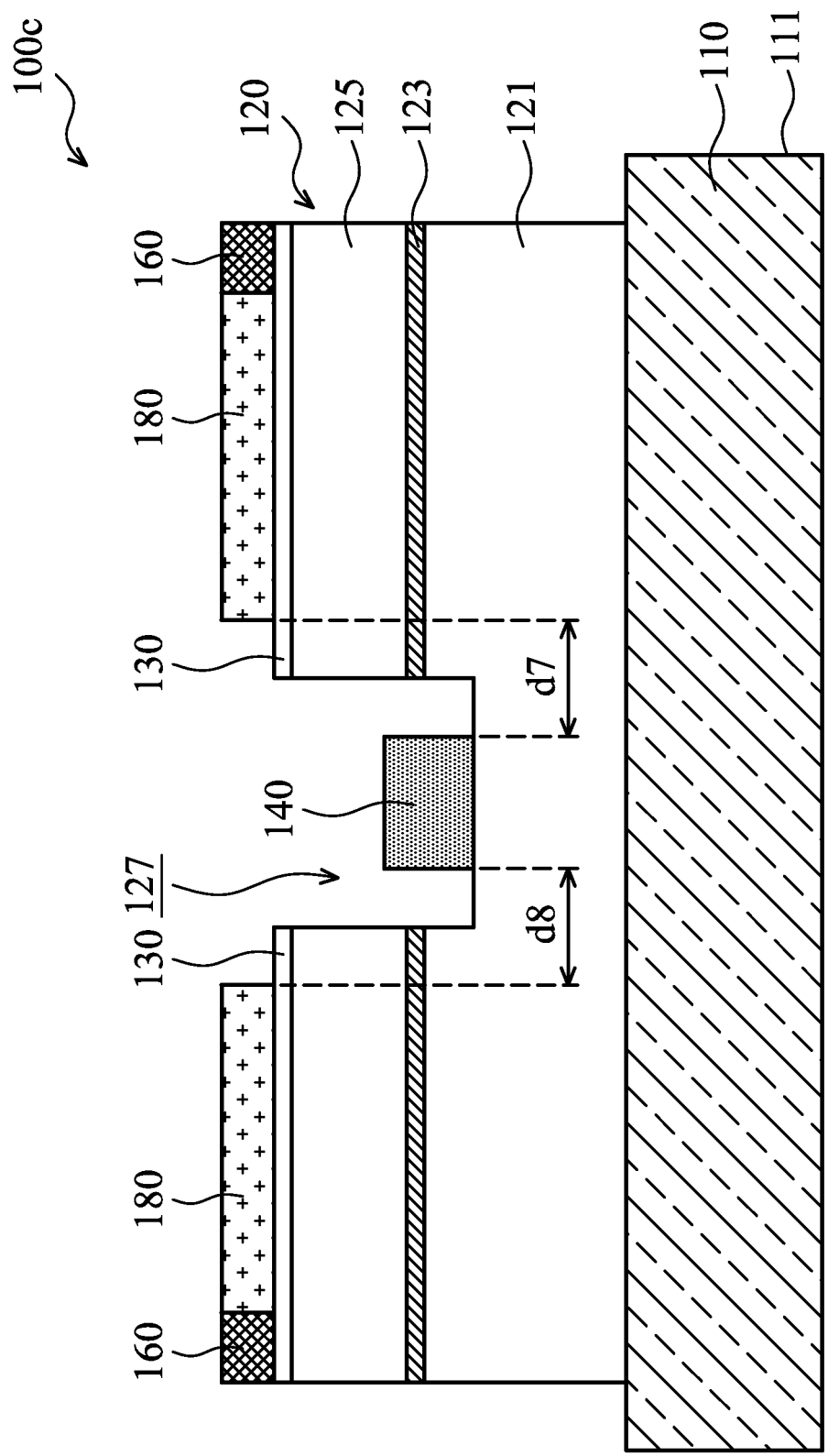
FIG. 6 shows a cross-sectional view of the LED chip taken along the line C-C of FIG. 5.
Figure 7:
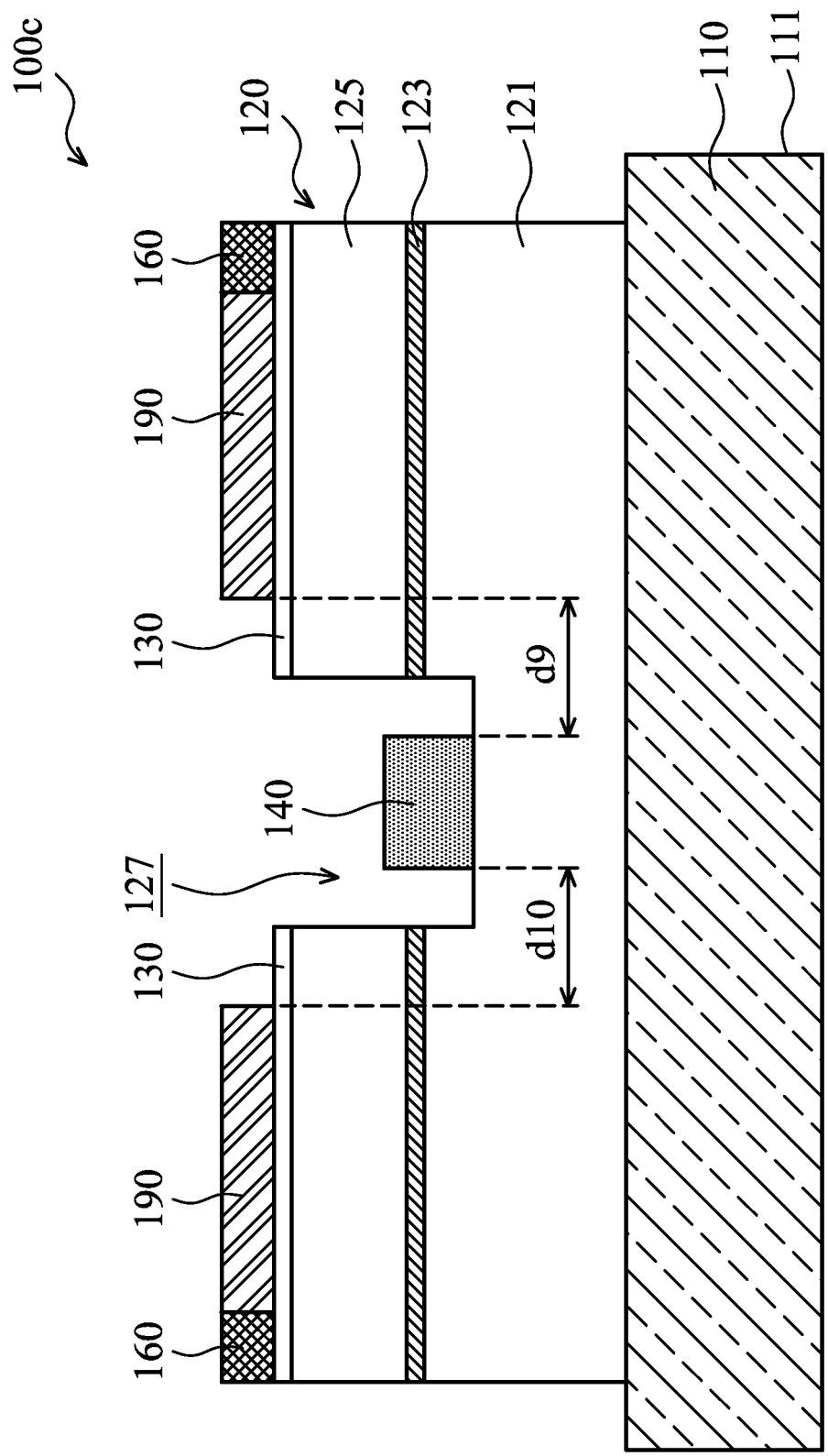
FIG. 7 shows a cross-sectional view of the LED chip taken along the line D-D of FIG. 5.

Referring to FIGS. 5, 6, and 7, a schematic top view of an LED chip 100c, in accordance with some embodiments, is shown in FIG. 5, and a cross-sectional view taken along the lines C-C and D-D of FIG. 5 is shown in FIGS. 6 and 7, respectively. Since elements similar to those of the LED chip 100a shown in FIGS. 1 and 2 are provided with the same reference numbers, the features thereof are not repeated in the interests of brevity. Differences between the LED chip 100a and the LED chip 100c include the LED chip 100c further including four second elongated electrodes 180 and four third elongated electrodes 190.

As shown in FIG. 5, in some embodiments, the four second elongated electrodes 180 and the four third elongated electrodes 190 are disposed on the conductive layer 130. Specifically, the four second elongated electrodes 180 are respectively connected to four bending portions of the first circular electrode 160 and extend toward the first electrode 140. The four bending portions respectively correspond to four corners of the substrate 110. In addition, corresponding to the center of one of the four edges of the substrate 110, each of the four third elongated electrodes 190 is connected to the first circular electrode 160 and extends toward the first electrode 140. Namely, the four second elongated electrodes 180 are spaced the same distance away from each other, and the four third elongated electrodes 190 are spaced the same distance away from each other. In addition, the four second elongated electrodes 180 and the four third elongated electrodes 190 are alternately arranged on the conductive layer 130.

As shown in FIG. 6, there is a space measuring a distance d7 between the first electrode 140 and the end of one of the second elongated electrode 180, and there is a space measuring a distance d8 between the first electrode 140 and the end of the other second elongated electrode 180. The two second elongated electrodes 180 are disposed on opposite sides of the first electrode 140, and the distance d7 is equal to the distance d8. Additionally, as shown in FIG. 7, there is a space measuring a distance d9 between the first electrode 140 and the end of one of the third elongated electrode 190, and there is a space measuring a distance d10 between the first electrode 140 and the end of the other third elongated electrode 190. The two third elongated electrodes 190 are disposed on opposite sides of the first electrode 140, and the distance d9 is equal to the distance d10. In one exemplary embodiment, the distances d7 and d8 are 0.05 mm, and the distances d9 and d10 are 0.08 mm, the distances d7 and d8 are smaller than distances d9 and d10, but the disclosure should not be limited to the embodiment.

With the arrangement of the second elongated electrodes 180 and the third elongated electrodes 190, the electric current is uniformly distributed inwardly via the second and third elongated electrodes 180 and 190. In addition, the distribution of the second and third elongated electrodes 180 and 190 minimizes the light-blocking area, so that the light-emitting area is increased and the luminous intensity is improved accordingly.

Figure 8:
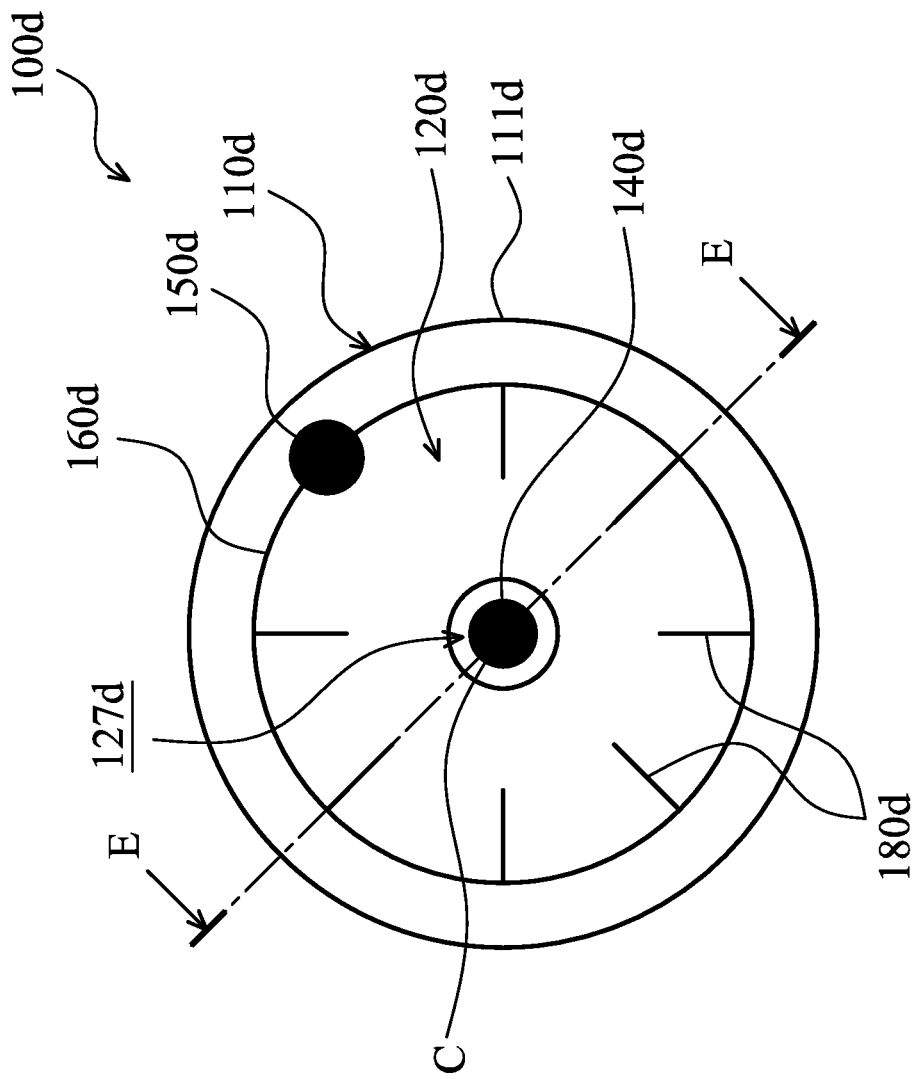
FIG. 8 shows a schematic top view of an LED chip, in accordance with some embodiments.
Figure 9:
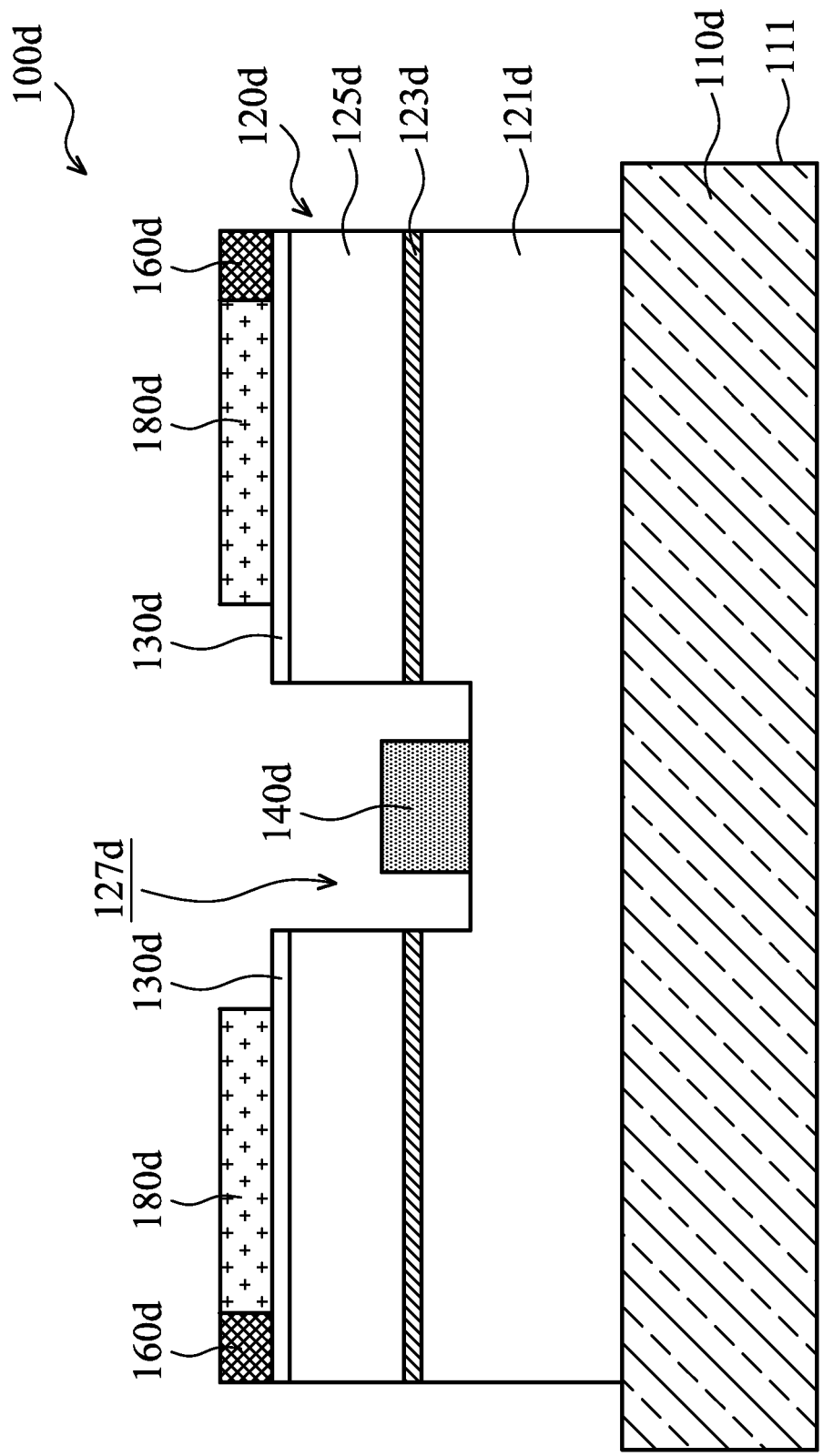
FIG. 9 shows a cross-sectional view of the LED chip taken along the line E-E of FIG. 8.

Referring to FIGS. 8 and 9, a schematic top view of an LED chip 100d, in accordance with some embodiments, is shown in FIG. 8, and a cross-sectional view taken along the line E-E of FIG. 8 is shown in FIG. 9. In some embodiments, the LED chip 100d includes a substrate 110d, a semiconductor element 120d, a conductive layer 130d, a first electrode 140d, a second electrode 150d, a first circular electrode 160d, and a number of fourth elongated electrodes 180d.

In some embodiments, the difference between the substrate 110d, semiconductor element 120d, and conductive layer 130d and the substrate 110, semiconductor element 120, and conductive layer 130 shown in FIGS. 1 and 2 is that the substrate 110d, semiconductor element 120d, and conductive layer 130d have circular cross sections. Therefore, the features of the substrate 110d, semiconductor element 120d, and conductive layer 130d are not repeated in the interests of brevity.

The first electrode 140d corresponds to the substantial center of the substrate 110d and is formed on the first-type semiconductor layer 121. The second electrode 150d is adjacent to the edge 111d of the substrate 110d and is formed on the conductive layer 130d. The first circular electrode 160d extends along the edge 111d of the substrate 110d and is connected to the second electrode 150d by its two ends, so as to form a closed loop circuit. The fourth elongated electrodes 180d are formed on the conductive layer 130d and are spaced the same distance away from each other. The fourth elongated electrodes 180d are connected to the first circular electrode 160d and extend toward the first electrode 140d.

With the arrangement of the fourth elongated electrodes 180d, the electric current is uniformly distributed inwardly via the fourth elongated electrodes 180d. In addition, the distribution of the fourth elongated electrodes 180d minimizes the light-blocking area, so that the light-emitting area is increased and the luminous intensity is improved accordingly.

The LED chip of the disclosure should not be limited to the embodiments described above. In the description below, some exemplary possible implementation methods of LED chips 100e~100g will be illustrated.

Referring to FIG. 10, a schematic top view of an LED chip 100e in accordance with some embodiments is shown. The LED chip 100e is characterized by the substrate 110e having a regular pentagon shape. A first circular electrode 160e surrounds the outer side of a first electrode 140e along an edge 111e of the substrate 110e and is connected to a second electrode 150e by its two ends, so as to form a closed loop circuit.

Referring to FIG. 11, a schematic top view of an LED chip 100f in accordance with some embodiments is shown. The LED chip 100f is characterized by the substrate 110f having a regular hexagon shape. A first circular electrode 160f surrounds the outer side of a first electrode 140f along an edge 111e of the substrate 110f and is connected to a second electrode 150f by its two ends, so as to form a closed loop circuit.

Referring to FIG. 12, a schematic top view of an LED chip 100g in accordance with some embodiments is shown. The LED chip 100g is characterized by the substrate 110g having an octagon shape. A first circular electrode 160g surrounds the outer side of a first electrode 140g along an edge 111g of the substrate 110g and is connected to a second electrode 150g by its two ends, so as to form a closed loop circuit.

In the present disclosure, the electric current for activating the LED chip is uniformly transmitted to the semiconductor element via the circular electrode that surrounds the first electrode. The current crowding effect is mitigated, and the distribution of current density is made uniform. Therefore, the quantum efficiency in the semiconductor element is enhanced, and the light extraction efficiency is improved. In addition, due to the minimization of the blocking area of the second electrode, the light-emitting area is increased and the luminous intensify is enhanced accordingly.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A LED chip, comprising:
   a substrate, wherein an orthographic projection of the substrate comprises five or more edges;
   a semiconductor element, comprising a first-type semiconductor layer, a light-emitting layer, and a second-type semiconductor layer stacked in order from the substrate, wherein a recess is formed on the second-type semiconductor layer, and a portion of the first-type semiconductor layer is exposed to the environment by the recess;
   a conductive layer, disposed on the second-type semiconductor layer;
   a first electrode, disposed on the portion of the first-type semiconductor layer that is exposed by the recess;
   a second electrode, disposed on the conductive layer; and
   a first circular electrode, disposed on the conductive layer, wherein the first circular electrode extends along the edges of the substrate and is electrically connected to the second electrode so as to form a closed loop circuit.

2. The LED chip as claimed in claim 1, wherein a thickness of the conductive layer is in a range from 60 nm to 160 nm.

3. The LED chip as claimed in claim 1, wherein the first-type semiconductor layer is an N-type semiconductor layer and the second-type semiconductor layer is a P-type semiconductor layer, or the first-type semiconductor layer is a P-type semiconductor layer and the second-type semiconductor layer is an N-type semiconductor layer.

4. The LED chip as claimed in claim 1, further comprising a second circular electrode, disposed on the conductive layer and located between the first electrode and the first circular electrode, wherein the second circular electrode extends in a manner parallel to the first circular electrode and is electrically connected to the second electrode via a first elongated electrode.

5. The LED chip as claimed in claim 2, wherein the first circular electrode and the second circular electrode are spaced the same distance apart.

6. The LED chip as claimed in claim 1, wherein the lengths of the edges are equal.

7. The LED chip as claimed in claim 1, further comprising a plurality of second elongated electrodes formed on the conductive layer, wherein the first circular electrode has a plurality of bending portions, and each of the second elongated electrodes extends toward the first electrode from the bending portions.

8. The LED chip as claimed in claim 5, further comprising a plurality of third elongated electrodes formed on the conductive layer, wherein the third elongated electrodes are spaced the same distance away from each other, and each of the third elongated electrodes is disposed between two neighboring second elongated electrodes and extends toward the first electrode from the first circular electrode.

9. A LED chip, comprising:
   a substrate, wherein an orthographic projection of the substrate is a circular shape;
   a semiconductor element, comprising a first-type semiconductor layer, a light-emitting layer, and a second-type semiconductor layer stacked in order from the substrate, wherein a recess is formed on the second-type semiconductor layer, and a portion of the first-type semiconductor layer is exposed to the environment by the recess;
   a conductive layer, disposed on the second-type semiconductor layer;
   a first electrode, disposed on the portion of the first-type semiconductor layer that is exposed by the recess;
   a second electrode, disposed on the conductive layer; and
   a first circular electrode, disposed on the conductive layer, wherein the first circular electrode extends along an edge of the substrate and is electrically connected to the second electrode so as to form a closed loop circuit.

10. The LED chip as claimed in claim 9, further comprising a plurality of fourth elongated electrodes formed on the conductive layer, wherein the fourth elongated electrodes are spaced the same distance away from each other, and each of the fourth elongated electrodes extends toward the first electrode from the first circular electrode.

11. The LED chip as claimed in claim 9, wherein a thickness of the conductive layer is in a range from 60 nm to 160 nm.

12. The LED chip as claimed in claim 9, wherein the first-type semiconductor layer is an N-type semiconductor layer and the second-type semiconductor layer is a P-type semiconductor layer, or the first-type semiconductor layer is a P-type semiconductor layer and the second-type semiconductor layer is an N-type semiconductor layer.

13. The LED chip as claimed in claim 9, further comprising a second circular electrode, disposed on the conductive layer and located between the first electrode and the first circular electrode, wherein the second circular electrode extends in a manner parallel to the first circular electrode and is electrically connected to the second electrode via a first elongated electrode.

14. The LED chip as claimed in claim 13, wherein the first circular electrode and the second circular electrode are spaced the same distance apart.

* * * * *